United States Patent [19]
Meier et al.

[11] Patent Number: 5,379,020
[45] Date of Patent: Jan. 3, 1995

[54] HIGH-TEMPERATURE SUPERCONDUCTOR AND ITS USE

[75] Inventors: Jürg Meier, Stein am Rhein; Willi Paul, Wettingen, both of Switzerland

[73] Assignee: ABB Research Ltd., Zurich, Switzerland

[21] Appl. No.: 243,167

[22] Filed: May 16, 1994

[30] Foreign Application Priority Data

Jun. 4, 1993 [DE] Germany .............................. 4318562

[51] Int. Cl.6 .......................... H01F 7/22; H02H 7/00
[52] U.S. Cl. ...................................... 505/211; 361/19;
174/125.1; 336/DIG. 1; 505/701; 505/704;
505/705; 505/850; 505/879; 505/880; 505/1;
505/213; 505/220
[58] Field of Search ............................... 335/216, 299;
336/DIG. 1; 174/125.1, 15.4, 15.5; 505/704,
705, 879, 880, 884, 886, 887, 917, 924, 925, 926,
927, 928, 1, 701, 826, 850, 851; 29/599; 361/19,
141

[56] References Cited

U.S. PATENT DOCUMENTS

5,140,290  8/1992  Dersch .

FOREIGN PATENT DOCUMENTS

1765109   10/1975  Germany .
4124980A1  3/1988  Germany .
3726037A1  2/1989  Germany .
3803285A1  8/1989  Germany .
3919465A1 12/1990  Germany .
4019368A1 12/1991  Germany .
4107686A1  9/1992  Germany .
4119983A1 12/1992  Germany .

*Primary Examiner*—Leo P. Picard
*Assistant Examiner*—Raymond M. Barrera
*Attorney, Agent, or Firm*—Burns, Doane, Swecker & Mathis

[57] ABSTRACT

In the case of high-temperature superconductors (6) which are used as inductive current limiters, unless any special precautionary measure is taken, there is a risk that short-circuit currents can lead to local stress centers and hot spots, and to local destruction of the high-temperature superconductor. In order to avoid this, a hollow cylinder (SL) of the high-temperature superconductor (6) is coated with a 1 $\mu$m thick conductive-silver layer (E1). A second 10 $\mu$m thick metal layer of foil made of silver or aluminum can be deposited thereon. In order to reduce or to avoid tensile stresses in the ceramic of the hollow cylinder (SL) made of a high-temperature superconductor, and in order to reduce the electrical contact resistance of the metal layers, this hollow cylinder (SL) has a mechanical reinforcing element (7), made of an elastic steel wire, wound around it, at room temperature, under tensile stress. Subsequently, this reinforcing element (7) is fixed by means of a solder or a cold-resistant synthetic resin (8), so that reinforcing element tensile stress and a compressive pressure on the hollow cylinder (SL) are maintained even at temperatures below 100K.

10 Claims, 1 Drawing Sheet

HIGH-TEMPERATURE SUPERCONDUCTOR AND ITS USE

BACKGROUND OF THE INVENTION

1. Field of the Invention

The invention is based on a high-temperature superconductor according to the preamble of patent claim 1. The invention also relates to a use of the high-temperature superconductor.

2. Discussion of Background

In the preamble of patent claim 1, the invention makes reference to a prior art as is disclosed in DE-A1-4 124 980. In the case of the hollow-cylindrical, stablilized, ceramic, high-temperature superconductor specified there, noble metal bars or conductors are provided within said high-temperature superconductor in good electrical contact with it and parallel to its longitudinal axis. The hollow cylinder is provided at its ends with two contact pieces which are made of sheet silver and are connected to one another via the electrical noble-metal conductors.

U.S. Pat. No. 5,140,290 discloses a device for inductive current limiting of an alternating current, in the case of which device the current which is to be limited flows through an induction coil. Arranged in the interior of this coil is a hollow cylinder, made of a high-temperature superconductor, and a soft-magnetic material of high permeability is arranged concentrically therein. During normal operation and at the rated current, the superconductivity of the hollow cylinder shields its interior, so that the impedance of the induction coil is very low. In the case of an overcurrent, for example as a result of a mains short, the superconductivity disappears and the impedance of the induction coil reaches its maximum, current-limiting value.

These voltage and current loads in the event of brief overcurrents above the critical current and with electrical voltages of several mV/cm to V/cm lead to so-called hot spots. Local increases in the electrical voltage occur as a result of small inhomogeneities in the material of the high-temperature superconductor. These lead to increased energy dissipation and thus to heating at this point. The consequence is an increasing local elevation of the resistance and hence of the voltage drop. In the event of a relatively long load, this effect leads to local destruction of the high-temperature superconductor.

DE-A1-4 019 368 discloses a method for producing cylinders or rings of a high-temperature superconductor based on a bismuth 2-layer cuprate. In this case, the homogeneous melt is cast into a rotating, cold casting mold. As a result of highly different solidification rates at the edge and in the interior of the sample, a structure is produced having a highly different density and being full of internal stresses.

The sensitivity of such high-temperature superconductors, as are used, for example, for shielding electromagnetic fields at temperatures below 100K or as inductive current limiters, is due to the lack of any plastic deformation capability of the ceramic. In the event of tensile loading, stress peaks are produced at very small microscopic cracks, which stress peaks cannot be reduced plastically and lead to the cracks growing. The mechanical tensile stresses are caused by, for example, electromagnetic forces or temperature gradients.

In terms of the relevant prior art, reference is additionally made to DE-A-1 765 109, which discloses a stablilized alternating-current superconductor, in the case of which a conventional Type III superconductor, made of, for example, technetium or niobium/zirconium with a layer thereon of Type I or II superconductor of lead or niobium with a thickness of 1 $\mu$m–10 $\mu$m in each case is arranged, for example by dissociation, electroylsis or plasma deposition, in good electrical contact, on a hollow-cylindrical carrier made of copper or aluminum.

For ceramic high-temperature superconductors, specially dimensioned metal layers are required for electrical stabilization. In this case, making electrical contact is problematic.

DE-A1-3 919 465 discloses a current-limiting inductor coil having a winding through which current passes and having a hollow-cylindrical, superconductive core made of a metal-oxide ceramic superconductor which changes magnetically into a normally conductive state if a current threshold is exceeded in the winding. The cavity in the superconductive core is at least partially filled with a ferromagnetic material which can be alternately composed of superconductive and ferromagnetic material and can be thermally insulated from the superconductive core.

Once again, local hot spots can occur in the even of overcurrents, as a result of small inhomogeneties in the superconductor.

SUMMARY OF THE INVENTION

Accordingly, one object of the invention as it is defined in patent claim 1 is to achieve the object of specifying a high-temperature superconductor of the type mentioned initially, in the case of which local stress centres and hence local hot spots of the high-temperature superconductor are avoided. A use is defined in claim 10.

One advantage of the invention is that the current and voltage load capacity of high-temperature superconductors is considerably increased. The superconductor can be loaded with a multiple of the critical current, as is necessary for current-limiter applications.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
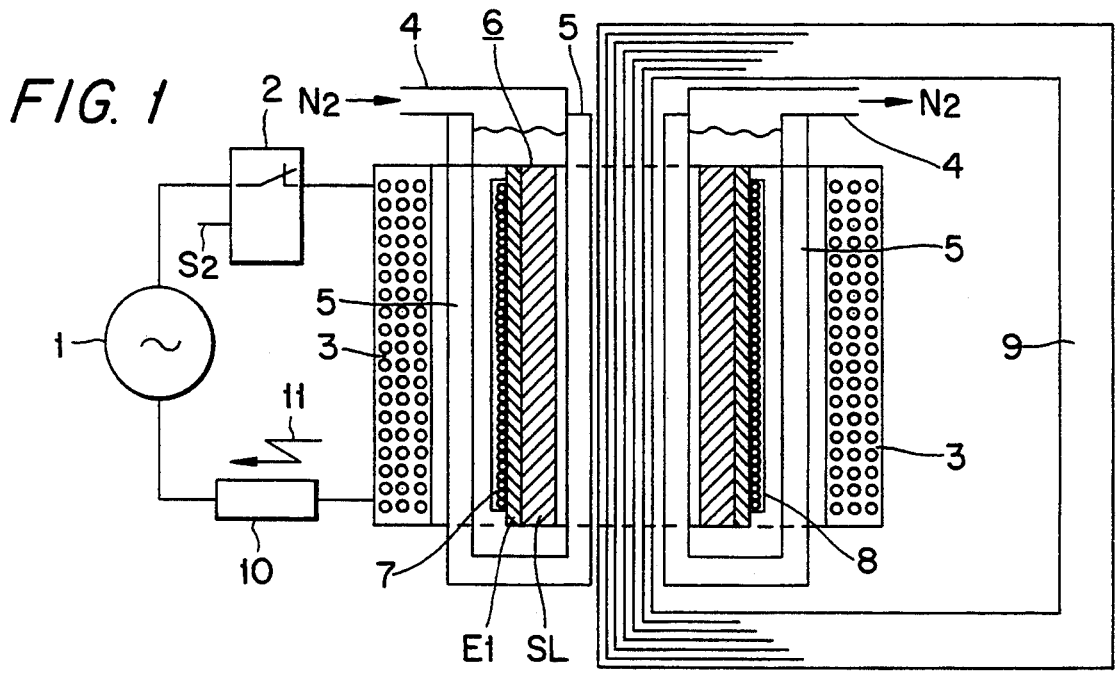
FIG. 1 shows an alternating-current circuit having a short-circuit current limiter which, in order to limit the current, has in the interior of an inductor coil a hollow-cylindrical high-temperature superconductor with a soft-magnetic core.

Referring now to the drawings, wherein like reference numerals designate identical or corresponding parts throughout the several views, in FIG. 1, an alternating-current source (1), for example a generator or transformer, is connected in series with an electrical power consumer or an electrical load (10), via a normally-closed contact or switch (2) and an inductor coil (3). A hollow-cylindrical high-temperature superconductor (6), which may be composed of a plurality of short cylinders and is superconductive during normal operation of the electrical load (10), is located in the interior of the inductor coil (3), within a cooler (4) which is at least partially filled with liquid nitrogen ($N_2$) and has a vacuum vessel (5). A core made of a soft-magnetic material, preferably a transformer core (9), is arranged in the interior of the hollow cylinder of the high-temperature superconductor (6), the inductance of which core is shielded from the inductor coil (3) by the superconductive high-temperature superconductor (6). It is, of course, also possible likewise to cool the inductor coil (3) or the transformer core (9), or both of them as well, using liquid nitrogen, that is to say to arrange it or them within the vacuum vessel (5).

In the event of a short circuit (11), which is indicated by an arrow, in the electrical load (10), the critical current intensity of the high-temperature superconductor (6) is exceeded as a result of an increased current flow through the inductor coil (3), so that the high-temperature superconductor (6) becomes normally conductive, and the inductance of the transformer core (9) becomes effective, and the short-circuit current through the inductor coil (3) is limited to a non-critical value. After this, the normally-closed contact (2) can be opened by a disconnect signal (S2), and the short-circuit current can be completely disconnected.

A first metal layer or silver layer (E1) made of a conductive-silver paste is deposited as an electrical reinforcing element on a hollow cylinder (SL) of the high-temperature superconductor (6), and a mechanical reinforcing element (7), made of steel wire, of a strip, of a fiber, or of fiberglass sheeting is wound thereon being subject to tensile stress, which mechanical reinforcing element (7) is fixed by a fixing means (8).

Figure 2:
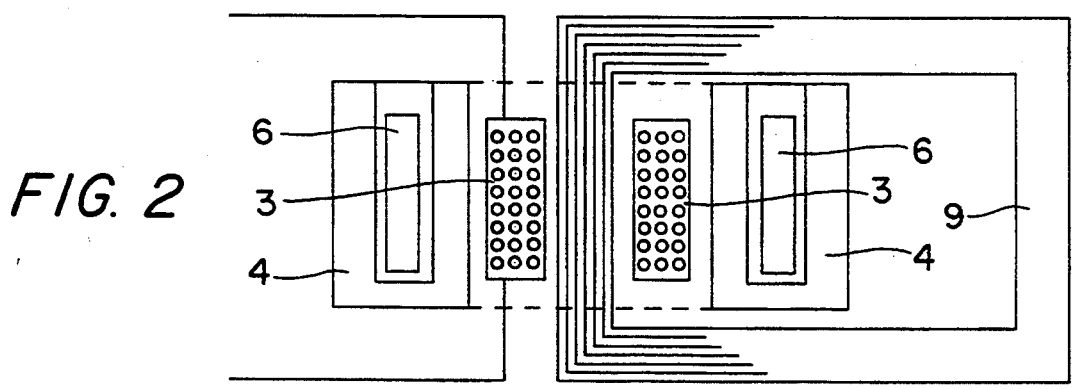
FIG. 2 shows a short-circuit current limiter according to FIG. 1, having an inductor coil in the interior of the high-temperature superconductor.

In contrast to FIG. 1, FIG. 2 shows an inductor coil (3) within the cavity of the high-temperature superconductor (6), one limb of the transformer core (9) being arranged inside the cavity of the inductor coil (3). In the case of this arrangement as well, the high-temperature superconductor (6) becomes normally conductive as a result of a short-circuit current and thus increases the impedance of the device formed by the inductor coil (3), high-temperature superconductor (6) and transformer core (9), so that the short-circuit current is limited.

Figure 3:
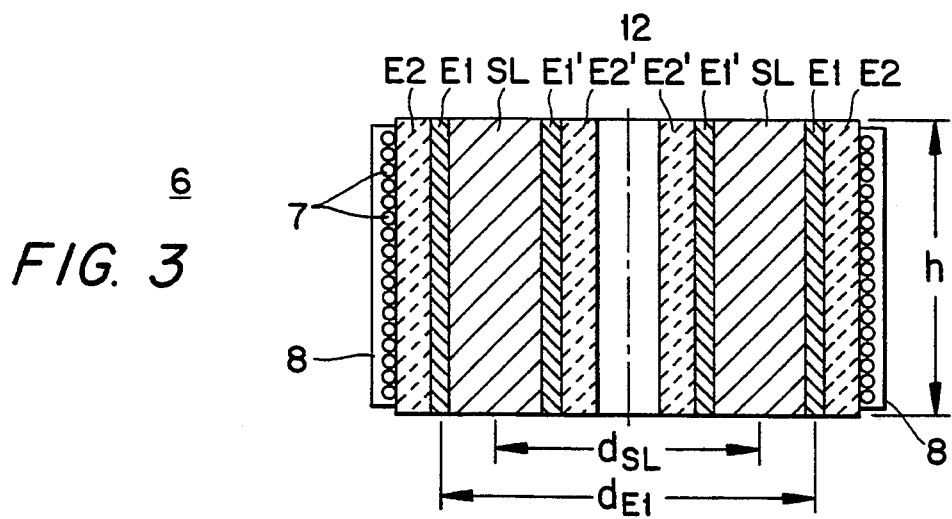
FIG. 3 shows a metallically coated high-temperature superconductor in cross section.

FIG. 3 shows a cross section, which is not drawn to scale, through a high-temperature superconductor (6) as can be used in the short-circuit current limiters according to FIGS. 1 and 2.

The first metal layer or silver layer (E1) made of conductive-silver paste and having a thickness of 1 $\mu$m is deposited on the circumferential side, on the outer surface, on a rotationally symmetrical hollow cylinder (SL) having a mean diameter ($d_{SL}$) of 20 cm, a height (h) of 10 cm and a wall thickness of 3 mm, and which is made of high-temperature superconductor. The mean diameter ($d_{E1}$) of this silver layer (E1) is virtually identical to the external diameter of the high-temperature superconductor (SL). A 10 $\mu$m thick second metal layer (E2) or foil made of silver or aluminum or a 100 $\mu$m thick second metal layer or foil made of lead, antimony, indium, bismuth, steel, tin, zinc or an alloy of these metals can be deposited in a single layer, as an electrical reinforcing element, on this silver layer (E1). This metal layer was wound around with 1000 turns of elastic steel wire and a cross section of 0.03 mm² or with the elastic reinforcing element (7), which is designed to withstand tensile stress and is fixed on the second metal layer (E2) by means of a solder or a cold-resistant synthetic resin or a glass-fiber-reinforced epoxy resin, or the fixing means (8). (12) designates the axis of the hollow cylinder (SL). The second metal layer (E2) could also be omitted as in FIG. 1.

Additionally or as an alternative, the silver layer (E1) and/or the second metal layer (E2) can also be deposited on the inner surface of the high-temperature superconductor (SL). The corresponding layers are provided with an apostrophe here. In this case, a reinforcing element (7) which is designed to withstand compression is expediently required (not illustrated) in the interior of the high-temperature superconductor (SL) in order to press the silver layer (E1') and possibly also the second metal layer (E2') against the high-temperature superconductor (SL), and in order to ensure a contact resistance of <1 m$\Omega$ cm.

The mechanical outer reinforcing element (7) holds the hollow cylinder (SL) under compressive pressure. At or above room temperature, the coated hollow cylinder (SL) is wound with a steel wire (7) which is subject to an approximately constant tensile stress ($\sigma_{BW}$) during winding. The winding is carried out using a winding machine, as is used for manufacturing copper coils. After winding, the individual turns are fixed, which can be done by soldering or by bonding by means of a cold-resistant synthetic resin.

In order to ensure the desired effect, that is to say the production of a compressive pressure in the high-temperature superconductor material both at room temperature and below 100K, the following requirements must be satisfied:

a) The tensile stress ($\sigma_{BW}$) at which the reinforcing element (7) is wound onto the coated hollow cylinder (SL) must be selected such that its elasticity range is not exceeded.

b) In order that the compressive pressure ($-\sigma_{SL}$) is maintained or, better, is increased in the high-temperature superconductor during cooling of the hollow cylinder (SL), a reinforcing element (7) is to be preferred whose coefficient of thermal expansion ($\alpha_A$) is greater than the coefficient of thermal expansion ($\sigma_{SL}$) of the material of the hollow cylinder (SL).

c) At the same time, the difference between the two coefficients of thermal expansion ($\alpha_A - \alpha_{SL}$) must not be so great that the reinforcing element tensile stress ($\sigma_A$) in the fixed reinforcing element (7) exceeds the elasticity range of said reinforcing element (7) during cooling.

It is possible to proceed as follows in order to calculate quantitatively the tensile stress ($\sigma_{SL}$) in the reinforcing element (7) and the compressive pressure ($-\sigma_{SL}$) in the high-temperature super-conductor):

at any temperature (T):

$$-\sigma_{SL} = K \cdot \sigma_A$$

where:

$$K = n \cdot S_A / S_{SL},$$

n = number of turns of the wire (7), $S_A$ = cross sectional area of the wire (7), $S_{SL}$ = wall cross sectional area of the hollow cylinder (SL).

At a temperature of the winding ($T_{BW}$) the compressive pressure is given by:

$$-\sigma_{SL}(T_{BW}) = K \cdot \sigma_{BW}. \quad (2)$$

Ignoring the temperature dependency of $\alpha$ and E then, for temperatures T which are not equal to $T_{BW}$:

$$\alpha_A(T_{BW}-T) + [\sigma_A(T_{BW}) - \alpha_A(T)]/E_A = \alpha_{SL}(T_{BW}-T) + [\sigma_{SL}(T_{BW}) - \sigma_{SL}(T)]/E_{SL} \quad (3)$$

where: $E_A$ = modulus of elasticity of the reinforcing element (7) and
$E_{SL}$ = modulus of elasticity of the high-temperature superconductor.

Substituting equations (1) and (2) in equation (3) produces:

$$-\sigma_{SL}(T) = \sigma_{BW}/K + K^{-1} \cdot (\alpha_A - \alpha_{SL}) \cdot (T_{BW}-T)/[K/E_{SL} + 1/E_A]$$

and $$\sigma_A(T) = \sigma_{BW} + (\alpha_A - \alpha_{SL}) \cdot (T_{BW}-T)/[K/E_{SL} + 1/E_A].$$

Example

The superconductive hollow cylinder ( SL ) had a radius of 10 cm, a height of 10 cm, a wall cross section $S_{SL}$ of 30 mm$^2$, a coefficient of expansion $\alpha_{SL} = 10 \cdot 10^{-6}$ and a modulus of elasticity $E_{SL} = 29$ GPa.

The steel wire (7) had n = 1000 turns, a cross section $S_A$ of 0.03 mm$^2$, a coefficient of expansion $\sigma_A = 15 \cdot 10^{-6}$, a modulus of elasticity $E_A = 200$ GPa and a tensile stress $\sigma_{BW} = 120$ MPa. The elasticity limit was 700 MPa.

The coefficient of expansion $\alpha_A$ is preferably given by: $5 \cdot 10^{-6} \leq \alpha_A \leq 25 \cdot 10^{-6}$, and the tensile stress $\sigma_{BW}$ is preferably given by: 10 MPa $\leq \sigma_{BW} \leq$ 500 MPa.

A synthetic material which can be obtained under the trade name Deltabond was used as the fixing means (8). No cracks were formed during cooling to 77K.

As a result of the electrical reinforcing element (E1, E2) and the mechanical reinforcing element (7), the current is commutated past locally occurring stress centres. The electrical power dissipated in the high-temperature superconductor (6) is thus drastically reduced, and local overheating is avoided. The electrical reinforcing element can be constructed from one metallic layer or from a plurality of metallic layers, internally and/or externally on the high-temperature superconductor (SL). These layers can be pressed on as foils or can also be deposited electrochemically or by means of plasma spraying or similar methods.

In order that the current can be commutated at each point, the contact resistance between the electrical reinforcing element (E1, E2) and the high-temperature superconductor (SL) must be as low as possible everywhere, preferably <1 m$\Omega$ cm, especially $\leq$1 $\mu\Omega$ cm.

In order that the high-temperature superconductor (SL) is significantly relieved of stress, the electrical resistance of the electrical reinforcing element (E1, E2) must be less than the resistance of the superconductor heated above the critical temperature ($T_C$). For a single reinforcing layer of thickness ($\delta_{E1}$) deposited onto the surface of the high-temperature superconductor (SL), this requirement means:

$$\delta_{E1}/\sigma_{E1} > \delta_{SL}/\sigma_{SL} \quad (4)$$

where $\sigma_{E1}$ = resistivity of the first metal layer (E1) at room temperature, $\sigma_{SL}$ = resistivity of the high-temperature superconductor (SL) at room temperature, and $\delta_{SL}$ = thickness or wall thickness of the high-temperature superconductor.

In general, for ml layers:

$$\Sigma \delta_{EM}/\sigma_{EM} > \delta_{SL}/\sigma_{SL} \quad (5)$$

the addition being carried out from m equals 1 to ml.

For current limiter applications, the resistance of the reinforcing element (E1, E2, 7) must be large enough to achieve the desired current limiting. In the event of a short circuit (11), that is to say when the full rated voltage ($U_N$) is dropped on the current limiter, the fault current is intended to be limited, typically, to k-times the rated current ($I_N$), where
$1 \leq K \leq 10$, preferably where $2 \leq k \leq 5$.

For a resistive current limiter (high-temperature superconductor directly in series with the line which is to be protected), which is preferably constructed in a meandering shape, this means that: the resistance of the electrical reinforcing element should be greater than $U_N/(k \cdot I_N)$. This meandering-shape resistor is mounted on an electrically non-conductive panel, which acts as a mechanical reinforcing element (not illustrated).

In the case of an inductive current limiter according to FIGS. 1 and 2, the line which is to be protected is inductively coupled to a superconductive high-temperature superconductor, via a normally conductive coil having n turns. A line current (I) and a voltage (U) dropped on the normally conductive inductor coil (3) are in this case transformed into the superconductive hollow cylinder (6) with a factor n (in the case of the current) and 1/n (in the case of the voltage). For the electrical resistance (R) of the reinforcing element (E1, E2, 7) of the high-temperature superconductor (6), this thus results in:

$$R > U_N/(n^2 \cdot K \cdot I_N) \quad (6)$$

or, if the electrical reinforcing element (E1, 7) is composed of a single layer of thickness ($\delta_{E1}$) and has a height (h):

$$2 \cdot \pi \cdot r \cdot \sigma_{E1} \cdot h/\delta_{E1} > U_N/(n^2 \cdot K \cdot I_N) \quad (7)$$

with a factor k, for which $1 \leq k \leq 10$, preferably $2 \leq k \leq 5$.

The thermal mass of the reinforcing element should be selected to be as large as possible in order to prevent thermal damage in the reinforcing element (E1, E2, 7). In the case of the present embodiment, the mechanical reinforcing element (7) is part of the electrical stabilization. The steel wire (7) acts as an additional electrical bypass. The short-circuit current will initially commutate on stress centres into the silver layer (E1) and into the second metal layer (E2), and then, to some extent, further into the steel wire (7). On the other hand, the pressure produced by the steel wire (7) leads to a reduction in the contact resistance between the various layers (E1, E2).

The high-temperature superconductor (6) was loaded with four times the value of the critical current for 0.1 s. In contrast to a high-temperature superconductor (6)

which is stablilized only mechanically by means of the reinforcing element (7) and was destroyed under this load, no damage occurred on the additionally electrically stabilized rings.

It is self-evident that dimensions and metal layers other than those stated can be used. It is important that at least one electrical reinforcing element (E1, E2), which acts as an electrical bypass, is also provided in addition to a mechanical reinforcing element (7).

The resistivity of the metallic conductors (E1, E2; E1' E2') should preferably be $>1\mu\Omega\text{cm}$ at 77K.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United State is:

1. A high-temperature superconductor, having at least one metallic electrical conductor on at least one conductor surface of a molding of the high-temperature superconductor and in good electrical contact with it, wherein the at least one metallic electrical conductor is deposited in the form of one or more layers or foils, for which:

$$\Sigma \delta_{Em}/\sigma_{Em} > \delta_{SL}/\sigma_{SL}$$

the addition being carried out from m=1 to m1, where m1=number of layers, $\sigma_{Em}$=resistivity of an $m^{th}$ metal layer at room temperature, $\sigma_{SL}$=resistivity of the molding at room temperature, $\delta_{Em}$=thickness or wall thickness of the $m^{th}$ metal layer, and $\delta_{SL}$=thickness or wall thickness of the molding of the high-temperature superconductor.

2. The high-temperature superconductor as claimed in claim 1,
   a) wherein the molding of the high-temperature super conductor is a hollow cylinder, and
   b) wherein at least one elastic reinforcing element is provided in order to press the at least one metallic electrical conductor against the hollow cylinder.

3. The high-temperature superconductor as claimed in claim 2,
   a) wherein the reinforcing element is composed of wire, strip or fiberglass sheeting, and
   b) wherein the coefficient of thermal expansion of the reinforcing element is greater than that of the material of the hollow cylinder.

4. The high-temperature superconductor (6) as claimed in claim 1, wherein the electrical contact resistance between the at least one metallic electrical conductor and the molding of the high-temperature superconductor is $<1$ m$\Omega$ cm.

5. The high-temperature superconductor as claimed in claim 2, wherein the coefficient of thermal expansion $\alpha_A$ of the reinforcing element is greater than that of the material of the hollow cylinder.

6. The high-temperature superconductor as claimed in claim 5, wherein $5 \cdot 10^{-6} \leq \alpha_A \leq 25 \cdot 10^{-6}$.

7. The high-temperature superconductor as claimed in claims 2, wherein the difference between the coefficient of thermal expansion of the reinforcing element and the coefficient of thermal expansion of the high-temperature superconductor is not so great that the reinforcing element exceeds its elasticity range during cooling.

8. The high-temperature superconductor as claimed in claims 2,
   a) wherein the reinforcing element is fixed by a fixing means in such a manner that the hollow cylinder is subject to compressive pressure at all in-use temperatures,
   b) wherein, in particular, the fixing means is a solder, a cold-resistant synthetic resin or a glass-fiber-reinforced epoxy resin.

9. The high-temperature superconductor as claimed claim 1,
   a) wherein the at least one metallic electrical conductor has a resistivity of $>1$ $\mu\Omega$ cm at 77K.,
   b) wherein, in particular, the metallic electrical conductor includes lead, antimony, indium, bismuth, steel, tin, zinc or alloys of these metals, and
   c) is pressed on as a foil or,
   d) is deposited by plasma spray or flame spray, or
   e) is deposited by means of an electrochemical process.

10. Use of a high-temperature superconductor as claimed in claim 1 for current limiting in a current limiter circuit, in particular having an inductor coil as the current-limiting component, where:

$$R > U_N/(n^2 \cdot k \cdot I_N)$$

for the electrical resistance (R) of the entire electrical and mechanical reinforcement (E1, E2; E1' E2' 7) of the high-temperature superconductor where $U_N$=rated voltage, $I_N$=rated current, n=number of turns of the inductor coil, k=factor where $1 \leq k \leq 10$.

* * * * *